United States Patent
Peng et al.

(10) Patent No.: US 7,141,495 B2
(45) Date of Patent: Nov. 28, 2006

(54) METHODS AND FORMING STRUCTURES, STRUCTURES AND APPARATUSES FOR FORMING STRUCTURES

(75) Inventors: Shuang-Neng Peng, Sinjhuang (TW); Chun-Hung Chen, Yongjing Township, Changhua County (TW); Soon Kang Huang, Hsinchu (TW); Weng-Liang Fang, Hsinchu (TW)

(73) Assignee: Taiwan Semiconductor Manufacturing Co. Ltd., Hsin-chu (TW)

( * ) Notice: Subject to any disclaimer, the term of this patent is extended or adjusted under 35 U.S.C. 154(b) by 0 days.

(21) Appl. No.: 10/925,610

(22) Filed: Aug. 25, 2004

(65) Prior Publication Data

US 2006/0046492 A1    Mar. 2, 2006

(51) Int. Cl.
*H01L 21/44* (2006.01)

(52) U.S. Cl. .............. 438/672; 438/637; 438/700; 438/680; 438/E21.584

(58) Field of Classification Search ............ None
See application file for complete search history.

(56) References Cited

U.S. PATENT DOCUMENTS

| | | | |
|---|---|---|---|
| 5,676,590 A | | 10/1997 | Hiraoka |
| 5,906,949 A | | 5/1999 | Sato |
| 6,294,467 B1 | * | 9/2001 | Yokoyama et al. ......... 438/680 |
| 6,825,156 B1 | * | 11/2004 | Lee et al. .................... 510/176 |
| 6,921,712 B1 | * | 7/2005 | Soininen et al. ............ 438/597 |
| 2002/0052115 A1 | | 5/2002 | Crevasse et al. |
| 2004/0121582 A1 | * | 6/2004 | Lee ............................ 438/622 |
| 2005/0215053 A1 | * | 9/2005 | Soininen et al. ............ 438/658 |

\* cited by examiner

Primary Examiner—Dung A. Le

(57) ABSTRACT

Methods of forming a contact structure, contact structures and apparatuses applied thereto are disclosed. The method of forming a contact structure forms a dielectric layer on a substrate. A metal contact with metal oxide thereon is formed in the dielectric layer. The solubility of the metal oxide is enhanced by using $H_2O$ with a temperature higher than about 10° C. or a chemical with a temperature higher than about 15° C.

20 Claims, 8 Drawing Sheets

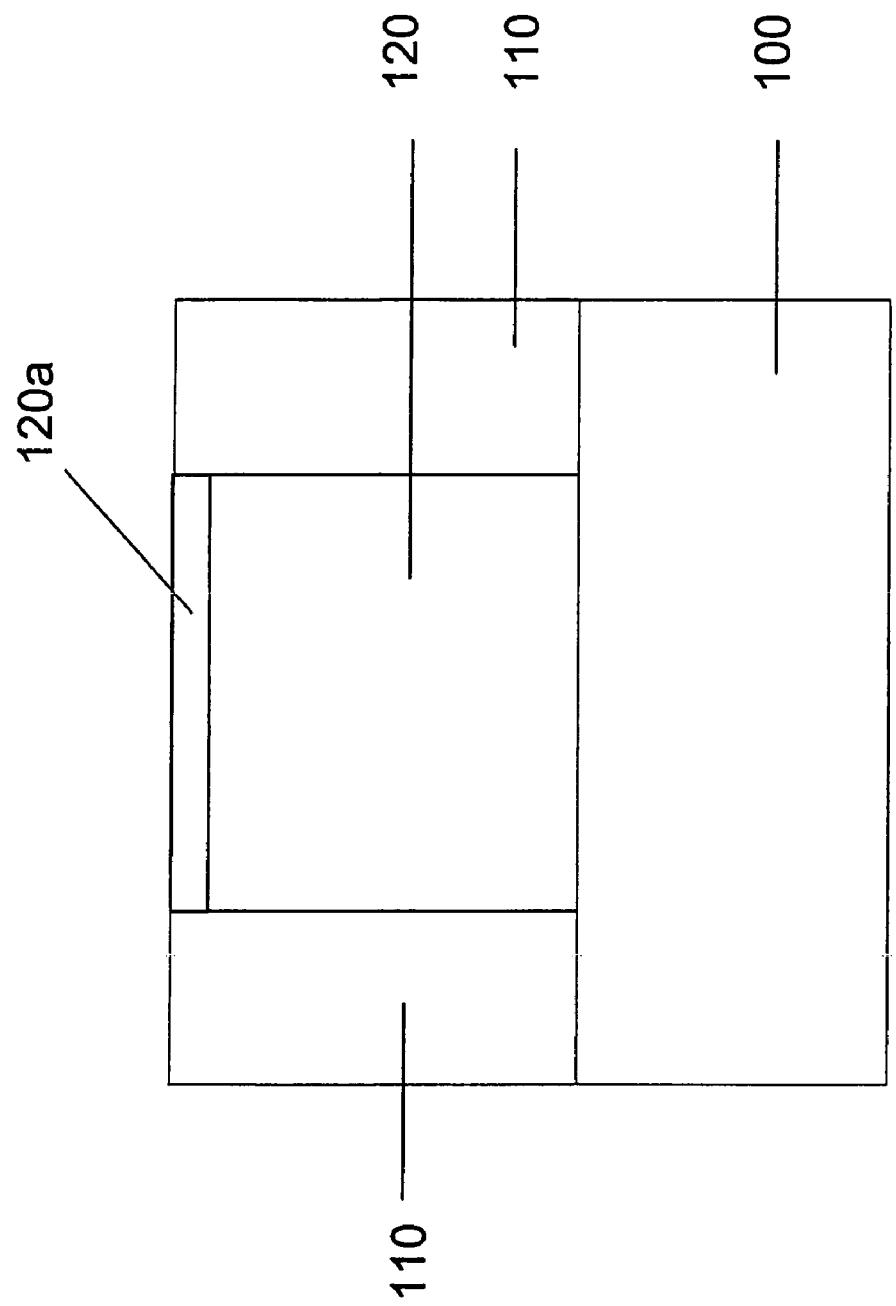

METHODS AND FORMING STRUCTURES, STRUCTURES AND APPARATUSES FOR FORMING STRUCTURES

BACKGROUND OF THE INVENTION

1. Field of the Invention

The present invention relates to the fabrication of integrated circuit devices on semiconductor substrates and, more particularly relates to methods of forming a contact structure, contact structures and apparatuses for forming the contact structures.

2. Description of the Related Art

The Complementary Metal Oxide Semiconductor (CMOS) technology has been recognized as the leading technology for use in digital electronics in general and for use in many computer products in particular. The miniaturization of CMOS technology according to a scaling rule is used in a semiconductor device to achieve large-scale integration and high-speed operation. For the miniaturization of CMOS devices, metal contacts have been widely applied in this industry.

FIG. 1 is a schematic cross sectional drawing showing a contact structure. The contact structure comprises a substrate 100, a dielectric layer 110, a metal contact 120 and a metal oxide 120a. The dielectric layer 110 is on the substrate 100. The metal contact 120 is formed in the dielectric layer 110. The metal oxide 120a is on the metal contact 120.

The method for forming the contact structure comprises providing a contact hole (not shown) in the dielectric layer 110. A metal layer (not shown) is filled in the contact hole and over the substrate 100. A chemical-mechanical polishing (CMP) process is then applied to the remove the metal layer which is above the surface of the dielectric layer 110 so as to form the metal contact 120. After the CMP process is performed, chemicals of the slurry used therein react with the metal contact 120. As a result, the metal oxide 120a is formed on the metal contact 120. Due to the high resistance of the metal oxide 120a, the resistance of the contact structure increases and may cause the failure of the circuit. Cleaning methods with chemical such as water or ammonia have been applied to the post-CMP contact structure in order to remove the metal oxide 120a.

U.S. Patent Application Publication No. 2002/0052115 A1 discloses a method of eliminating agglomerate particles in a polishing slurry. The method comprises conveying the waste slurry to the drain, wherein the waste slurry may form an agglomerate having an agglomerate particle size. The method further comprises subjecting the waste slurry to energy emanating from an energy source. The energy source thereby transfers energy to the waste slurry to substantially reduce the agglomerate particle size. By substantially reduced, it is meant that the agglomerate is size is reduced such that the waste slurry is free to flow through the drain.

U.S. Pat. No. 5,906,949 discloses a CMP process. The process is performed using a slurry containing abrasive particles mainly made of sialon or boehmite. This process is advantageous in improvement of a polishing rate without degradation in planarity of the processed surface and in level of metal impurities.

None of these applications address the problem described above.

SUMMARY OF THE INVENTION

The present invention relates to a method for removing metal oxide from a metal layer which enhances solubility of the metal oxide by using $H_2O$ with a temperature higher than about 10° C. or a liquid or vapor of a chemical with a temperature higher than about 15° C.

A method of forming a structure is disclosed. The method forms a dielectric layer on a substrate and a metal structure with metal oxide thereon in the dielectric layer. The method enhances solubility of the metal oxide by using $H_2O$ with a temperature higher than about 10° C. or a liquid or vapor of a chemical with a temperature higher than about 15° C.

A method of forming a structure is disclosed. The method forms a dielectric layer on a substrate, and a tungsten plug with tungsten oxide thereon in the dielectric layer. The method enhances solubility of the tungsten oxide by using $H_2O$ with a temperature higher than about 10° C. or a liquid or vapor of a chemical with a temperature higher than about 15° C.

A method of forming a contact structure is disclosed. The method provides a substrate having a dielectric layer thereon and a contact within the dielectric layer. A tungsten layer is formed in the contact hole and over the dielectric layer. A portion of the tungsten layer above a surface of the dielectric layer is removed by chemical-mechanical polishing (CMP) so as to form a tungsten plug with tungsten oxide thereon in the contact hole. The method performs a CMP oxide buffing process and a deionized (DI) water cleaning process. The method enhances solubility of the tungsten oxide by a liquid or vapor of $H_2O$ or chemical with a temperature from about 15° C. to about 100° C. for not less than about 5 seconds.

Contact structures are provided. The contact structures are formed according to the methods of forming a structure described above.

A cleaner of a chemical-mechanical polishing (CMP) apparatus comprises: an immersion megasonic module, a brush scrubber station, a spin rinse and a hot liquid or vapor module coupled to each other. The hot liquid or vapor module provides $H_2O$ with a temperature higher than about 10° C. or a liquid or vapor of a chemical with a temperature higher than about 15° C.

A cleaner of chemical-mechanical polishing (CMP) apparatus comprises: a roller, a pencil and a hot liquid or vapor module coupled to each other. The hot liquid or vapor module provides $H_2O$ or a chemical with a temperature not less than about 15° C.

The above and other features of the present invention will be better understood from the following detailed description of the preferred embodiments of the invention that is provided in connection with the accompanying drawings.

BRIEF DESCRIPTION OF THE DRAWINGS

FIG. 1 is a schematic cross sectional drawing showing a contact structure.

DESCRIPTION OF THE PREFERRED EMBODIMENT

Figure 2A:
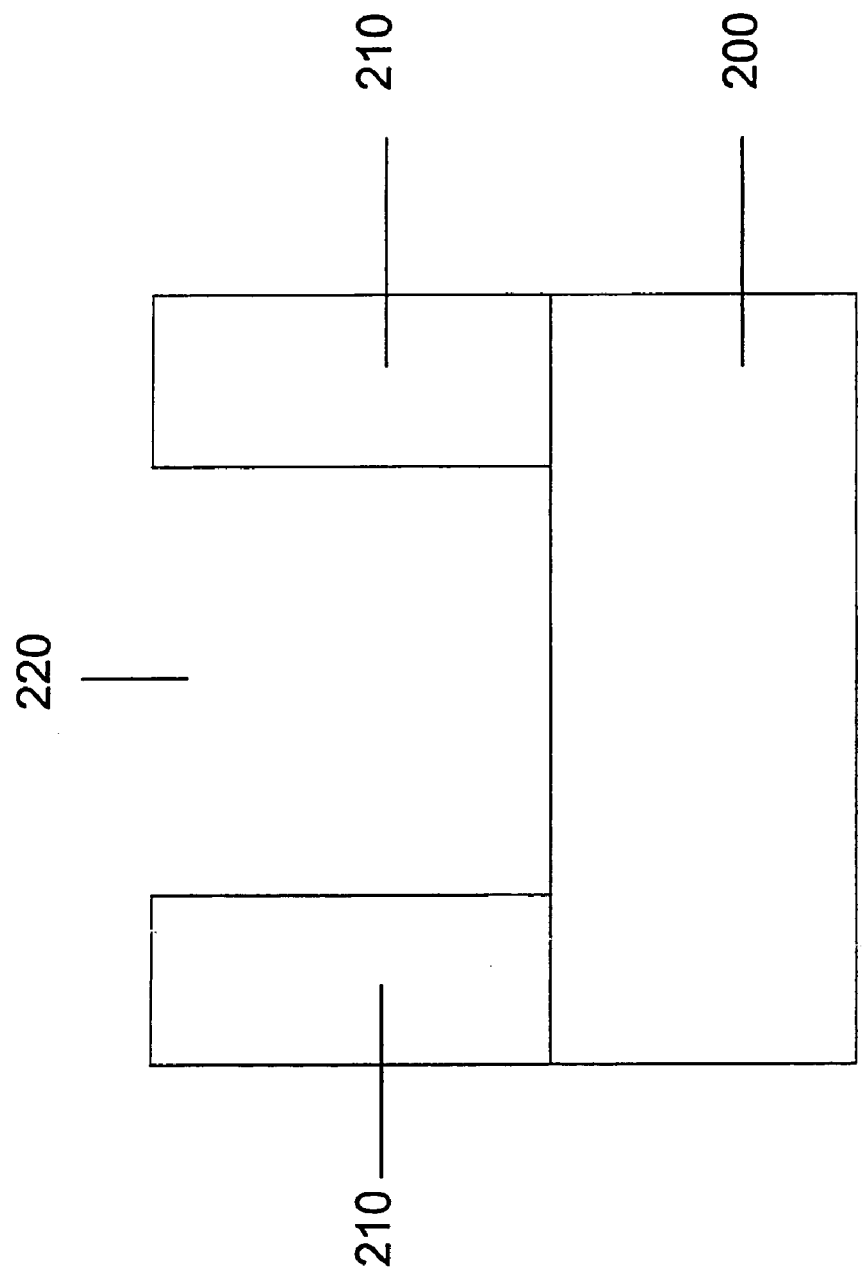
FIGS. 2A–2C are a series of schematic cross sectional diagrams illustrating an exemplary method for forming a contact structure.
Figure 2B:
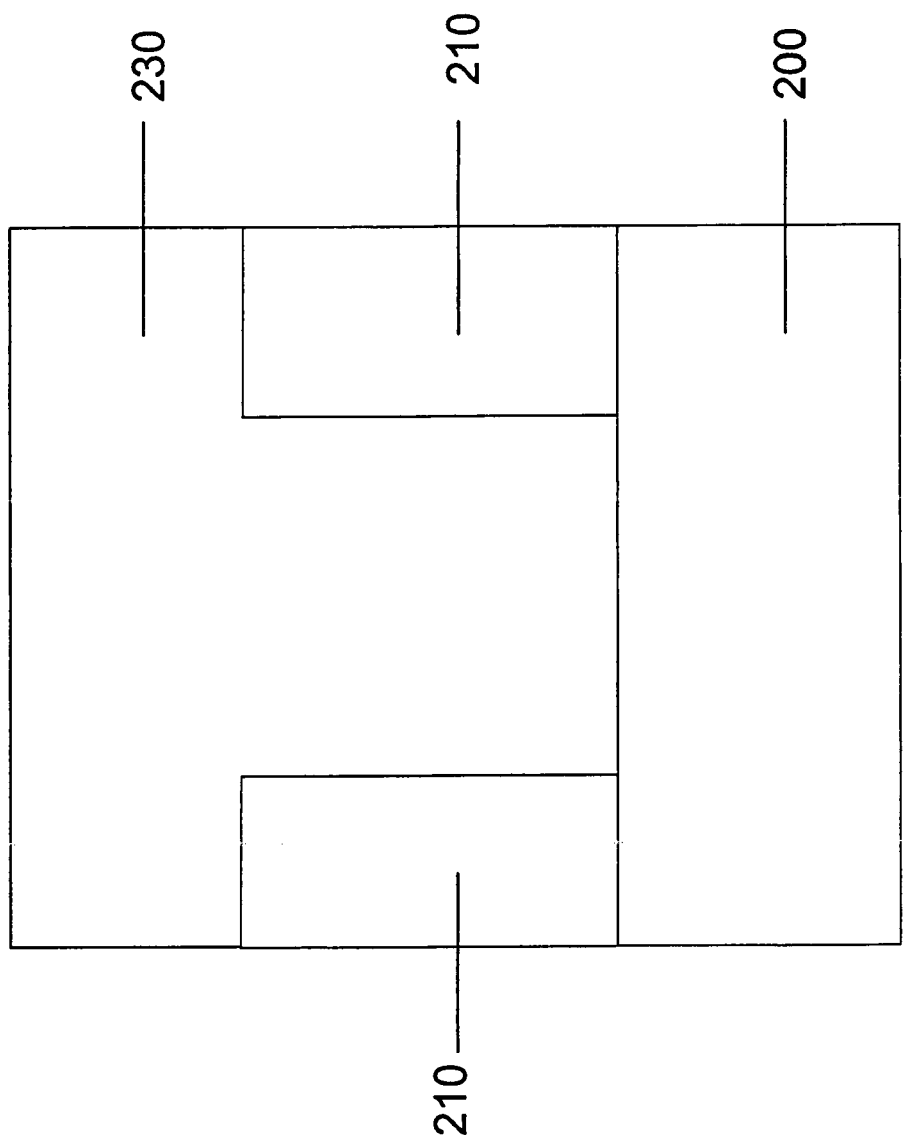
Figure 2C:
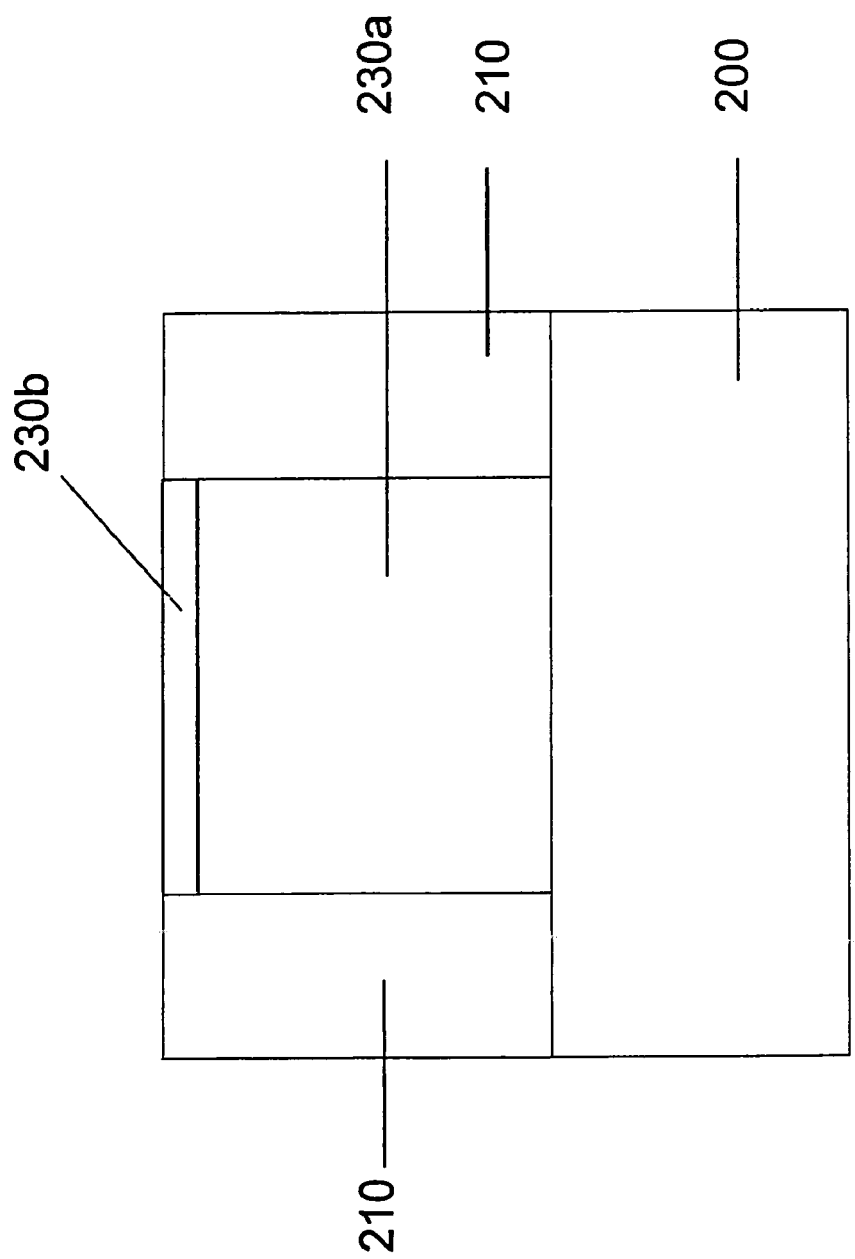

FIGS. 2A–2C are a series of schematic cross sectional diagrams illustrating an exemplary method for forming a contact structure.

In FIG. 2A, a dielectric layer 210 is formed over a substrate 200. A contact hole 220 is formed within the dielectric layer 210.

The substrate 200 can be, for example, a silicon substrate, a III–V compound substrate, a glass substrate, a liquid crystal display (LCD) substrate or the other substrate similar to those described above. The material of the dielectric layer 210 includes, for example, undoped silicate glass (USG), boron doped silicate glass (BSG), phosphorous doped silicate glass (PSG), boron phosphorous doped silicate glass (BPSG), polyimides, benzocyclobutene, parylenes, diamond-like carbon, poly(arylene ethers), cyclotenes, fluorocarbons, methyl silsesquioxane, hydrogen silsesquioxanes, nanoporous oxides or carbon doped silicon dioxides. The dielectric layer 210 can be formed by, for example, CVD, PVD, or spin coating. The contact hole 220 is formed, for example, by a photolithographic and an etch processes. A dielectric material (not shown) is formed over the substrate 200. By using a patterned photoresist layer (not shown) as an etch mask, the etch process removes a portion of the dielectric material so as to form the contact hole 220 within the dielectric layer 210.

Referring to FIG. 2B, a metal layer 230 is formed in the contact hole 220 shown in FIG. 2A and over the dielectric layer 210.

The metal layer 230 can be, for example, tungsten, aluminum, aluminum copper or copper. In this embodiment, the metal layer 230 is tungsten. The metal layer 230 can be formed by, for example, chemical vapor deposition (CVD), physical vapor deposition (PVD), electroplating, electroless plating or a combination thereof.

Referring to FIG. 2C, a portion of the metal layer 230 above the surface of the dielectric layer 210 is removed so as to form a metal contact 230a with metal oxide 230b thereon. The removal of the portion of the metal layer 230 can be performed, for example, by chemical-mechanical polishing (CMP), an etch-back process, an anti-electric plating processor a combination thereof. In this embodiment, the method is CMP. After CMP, the top surface of the metal contact 230a is subjected to the chemicals of slurries. When the pH value of the slurry is low enough, such as 4, metal contact 230a reacts with chemicals in the slurry so as to form the metal oxide 230b. In some situation, the metal oxide 230b may be formed due to the exposure of the metal contact 230a in atmosphere over a Q-time specification.

Figure 3:
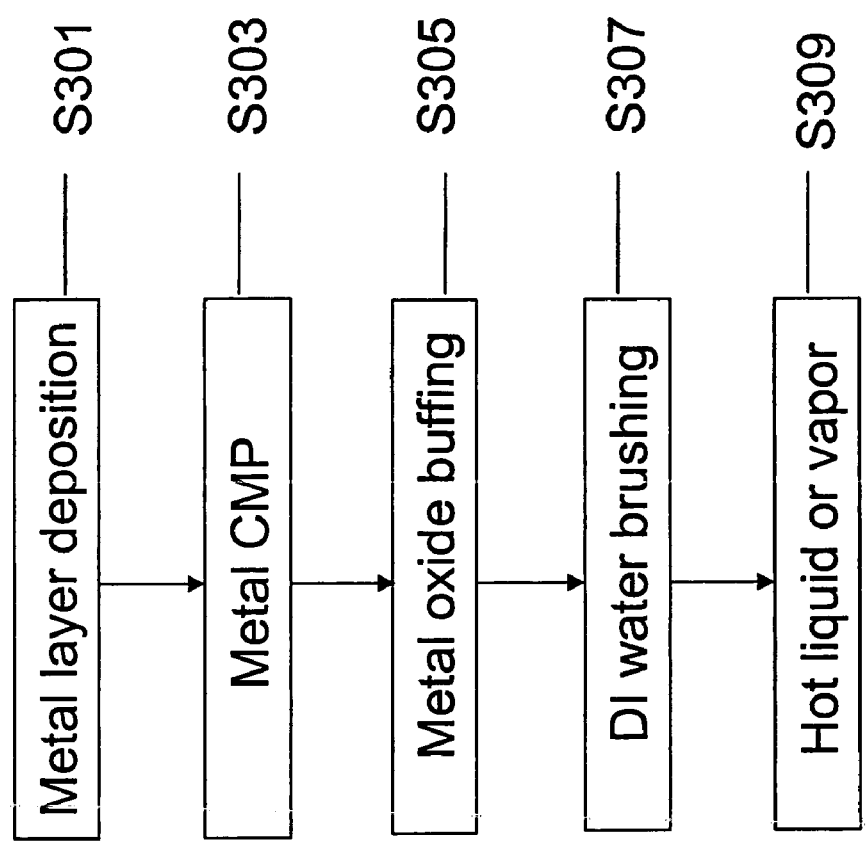
FIG. 3 is a process flow showing an exemplary method of removing metal oxide on a metal contact.

FIG. 3 is a process flow showing an exemplary method of removing metal oxide on a metal contact. The process flow comprises the steps of: metal layer deposition S301, metal CMP S303, a metal oxide buffing process S305, a deionized (DI) water brushing process S307 and a hot liquid or vapor process S309. The steps of the metal layer deposition S301 and the metal CMP S303 are similar to those described with reference to FIGS. 2B and 2C, respectively. Detailed descriptions are not repeated.

The metal oxide buffing process S305 removes remaining scratches from the previous metal CMP processes including residual material in the scratches. In this embodiment, the metal oxide buffing process S305 may remove tungsten oxide, for example, by using a slurry with KOH or $NH_4OH$. The metal oxide buffing process S305 may also be set by time or by end-point. One of ordinary skill in the art, after viewing the descriptions of this embodiment, will understand how to execute the metal oxide buffing process S305. The DI water or chemical brushing process S307 cleans the surface of the metal contact 230a shown in FIG. 2C. Usually, the DI water brushing process S307 uses DI water with a temperature higher than about 10° C. or a chemical with a temperature higher than about 15° C. The DI water brushing process S307 may be performed, for example, by a roller sponge.

The hot liquid or vapor process S309 enhances the solubility of the metal oxide 230b. In some embodiments, the temperature of the liquid or vapor is higher than, for example, about 15° C. Due to the temperature of the liquid or vapor, the equilibrium constant of the solubility of the metal oxide 230b is so increased that the solubility of the metal oxide 230b arises. The liquid or vapor may comprise, for example, $H_2O$ or a chemical. In some embodiments, the chemical comprises a pure polar solution or a polar solution with water in which the polar solution comprises, such as, ketone or alcohol. In this embodiment, the liquid or vapor is $H_2O$ has a temperature from about 15° C. to about 100° C. Moreover, the process time for the hot liquid or vapor process S309 is not less than, for example, about 5 seconds. Due to the adding of the liquid or vapor, the hot liquid or vapor process S309 is performed under a pH condition from about 4 to about 10. After the hot liquid or vapor process S309, the metal oxide 230b can be substantially removed. The contact resistance of the metal contact 230a is, accordingly, reduced. The requirement for the contact resistance of the metal contact 230a depends on designs of integrated circuits. It is not necessary that the whole metal oxide 230b be removed. As long as the contact resistance of the metal contact 230a passes the specification of the integrated circuits, some of the metal oxide 230b may remain on the metal contact 230a. One of ordinary skill in the art, after reading the disclosure of this embodiment, will understand how to modify the process time of the hot liquid or vapor process S309 or how to control the process conditions.

Figure 4:
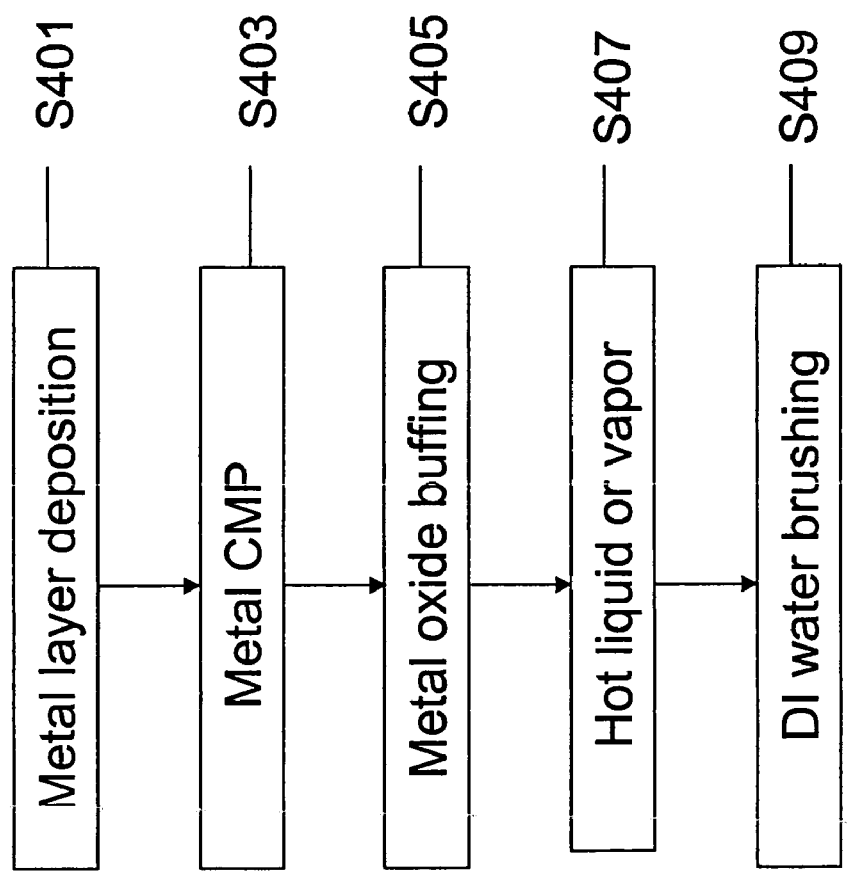
FIG. 4 is a process flow showing an exemplary method of removing metal oxide on a metal contact.

FIG. 4 is a process flow showing an exemplary method of removing metal oxide on a metal contact. The process flow comprises the steps of: metal layer deposition S401, metal CMP S403, a metal oxide buffing process S405, a hot liquid or vapor process S407 and a deionized (DI) water brushing process S409. The steps of the metal layer deposition S401, the metal CMP S403 and the metal oxide buffing process S405 in FIG. 4 are the same steps with reference numerals that are increased by 100 in FIG. 3. Detailed description of these steps are not repeated. The steps of the hot liquid or vapor process S407 and the DI water brushing process S409 are similar to the hot liquid or vapor process S 309 and the DI water brushing process S307, respectively. Detailed descriptions are not repeated.

Compared with the process flow in FIG. 3, the process flow in FIG. 4 exchanges the hot liquid or vapor process with the DI water brushing process so that the hot liquid or vapor process S 407 is performed after the metal oxide buffing process S405. Because the exchange of the process steps can achieve the same purpose, one of ordinary skill in the art, after viewing this embodiment, will know that the hot liquid or vapor process can be applied between any steps as long as the contact resistance of the metal contact 230a meets the requirements for the designs of the integrated circuits.

In some embodiments, the process flow may also comprise an $NH_4OH$ immersion process, an $NH_4OH$ brush cleaning process, a spin rinse dry process, a HF water brush cleaning process or a combination thereof. The application of these steps depends on the contact resistance, the manufacturing costs, the process time and so on. After viewing the description of this embodiment, one of the ordinary skill in the art will know and determine the combination of the process flow.

Figure 5:
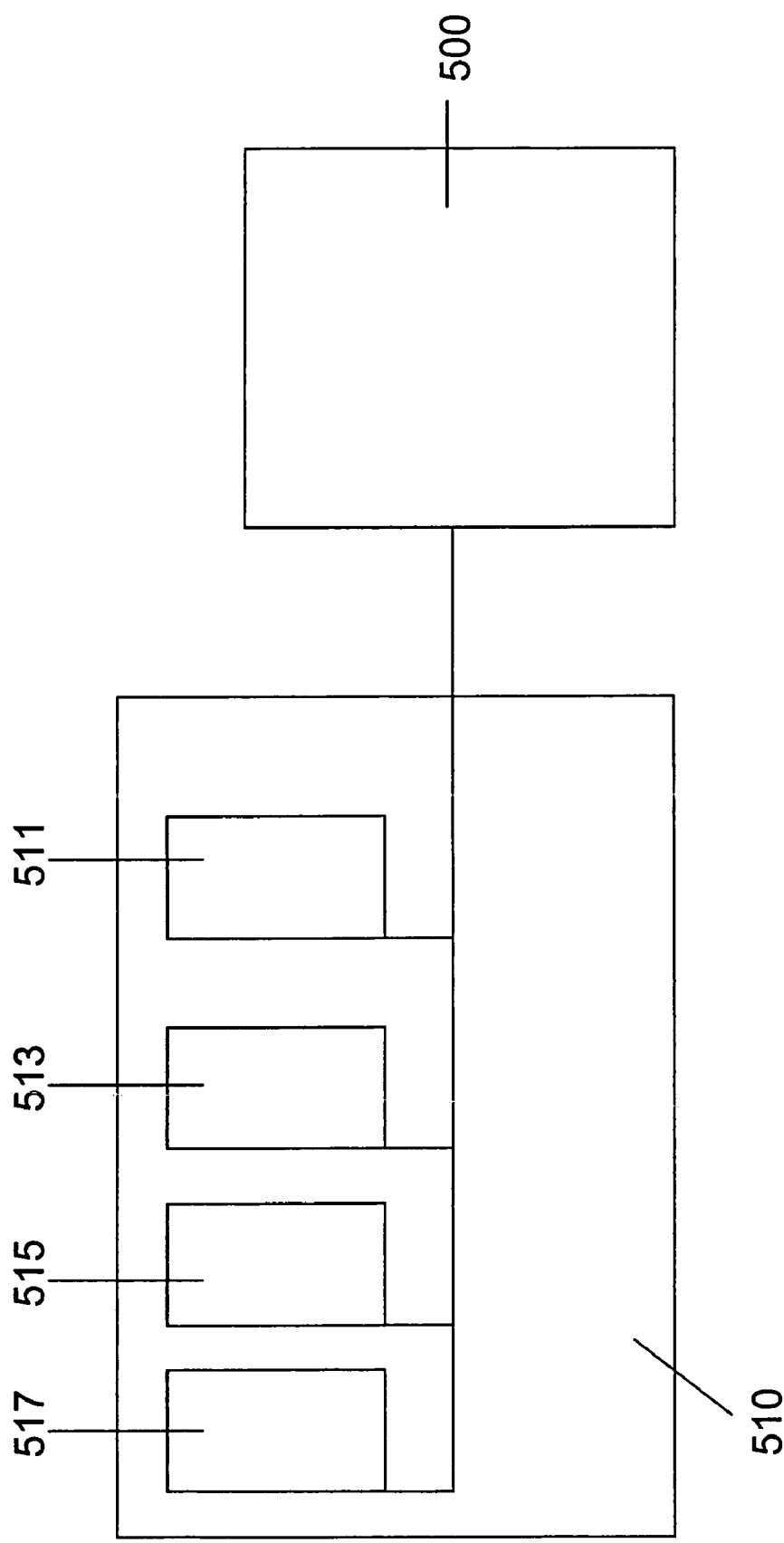
FIG. 5 is a schematic drawing showing an exemplary CMP apparatus.

FIG. 5 is a schematic drawing showing an exemplary CMP apparatus.

The CMP apparatus comprises a polisher 500 and a cleaner 510 coupled thereto. The cleaner 510 comprises: a tank 511, a brush scrubber station 513, a spin rinse 515 and a hot liquid or vapor module 517, which are coupled to each other. The polisher 500 serves the metal CMP processes S303 and S403. It may also serve the metal oxide buffing processes S305 and S405. The tank 511 may serve, for example, the $NH_4OH$ immersion process. The brush scrubber station 513 may serve, for example, the DI water brushing processes 307 and S409, the $NH_4OH$ brush cleaning process and the HF water brush cleaning process. The spin rinse 515 serves, for example, the spin rinse dry process. The hot liquid or vapor module 517 serves, for example, the hot liquid or vapor processes S309 and S407. In some embodiments, the hot liquid or vapor module 517 comprises a wet bench. The tank 511, the brush scrubber station 513, the spin rinse 515 and the hot liquid or vapor module 517 are not necessarily physically connected to each other. In some embodiments, these modules are coupled to each other through a control system. Accordingly, post-CMP wafers can smoothly go through these modules without interrupting the manufacturing.

Figure 6:
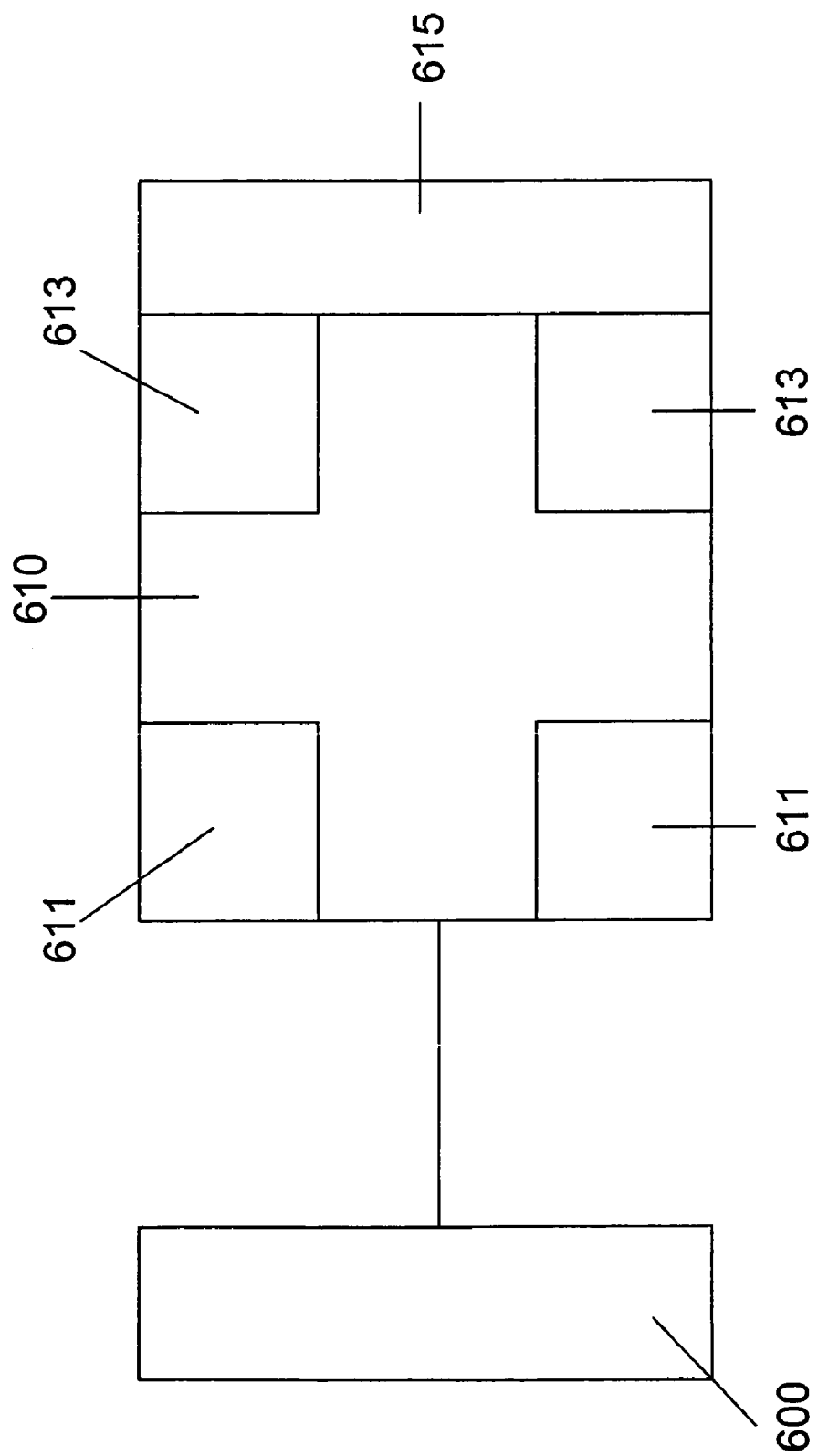
FIG. 6 is a schematic drawing showing another exemplary CMP apparatus.

FIG. 6 is a schematic drawing showing another exemplary CMP apparatus.

The CMP apparatus comprises a polisher 600 and a cleaner 610 coupled thereto. The cleaner 610 comprises: rollers 611, pencils 613 and a hot liquid or vapor module 615, which are coupled to each other. The polisher 600 serves the metal CMP processes S303 and S403. It may also serve the metal oxide buffing processes S305 and S405. The rollers 611 serve, for example, the DI water brush cleaning process. The pencils 613 serve, for example, the DI water pencil cleaning process and the spin rinse dry process. The hot liquid or vapor module 615 serves, for example, the hot liquid or vapor processes S309 and S407. In some embodiments, the hot liquid or vapor module 617 comprises a wet bench. The rollers 611, the pencils 613 and the hot liquid or vapor module 615 are not necessarily physically connected to each other. In some embodiments, these modules are coupled to each other through a control system. Accordingly, post-CMP wafers can smoothly go through these modules without interrupting the manufacturing.

It is not necessary that the arrangement of the components of the cleaners 510 and 610 be the same as shown in FIGS. 5 and 6. The arrangement of the these components relates to the space restriction of the cleaners 510 and 610 and smoothness for processes. With the requirement for the cleaner, one of ordinary skill in the art will understand how to arrange these components.

Although the present invention has been described in terms of exemplary embodiment, it is not limit thereto. Rather, the appended claims should be constructed broadly to include other variants and embodiments of the invention which may be made by those skilled in the field of this art without departing from the scope and range of equivalents of the invention.

What is claimed is:

1. A method of forming a structure, comprising:
   forming a dielectric layer on a substrate, a metal structure with metal oxide thereon in the dielectric layer, and
   enhancing solubility of the metal oxide by using H2O with a temperature higher than about 10° C. or a liquid or vapor of a chemical with a temperature higher than about 15° C.,
   wherein the chemical comprises a pure polar solution or a polar solution with H2O,
      wherein the step of forming the metal structure in the dielectric layer comprises: forming a hole in the dielectric layer; forming a metal layer in the hole and over the dielectric layer; and removing a portion of the metal layer above a surface of the dielectric layer, wherein the step of removing the portion of the metal layer comprises a chemical-mechanical polishing (CMP) process; and
   performing a CMP oxide buffing process after the CMP process, the step of enhancing the solubility of the metal oxide being performed after the CMP oxide buffing process.

2. The method of forming a structure of claim 1, further comprising performing a CMP cleaning process after the CMP process, the step of enhancing the solubility of the metal oxide being performed after the CMP cleaning process.

3. The method of forming a structure of claim 1, wherein the CMP cleaning process comprises a deionized (DI) water cleaning process, the step of enhancing the solubility of the metal oxide being performed after the deionized (DI) water cleaning process.

4. The method of forming a structure of claim 1, wherein the temperature of the liquid or the vapor increases an equilibrium constant of the solubility of the metal oxide.

5. The method of forming a structure claim 1, wherein the polar solution comprises ketone or alcohol.

6. The method of forming a structure of claim 1, wherein the temperature of the $H_2O$ or the chemical is from about 15° C. to about 100° C.

7. The method of forming a structure of claim 6, wherein a time for the step of enhancing solubility of the metal oxide by a liquid or vapor is not less than about 5 seconds.

8. The method of forming a structure of claim 1, wherein the step of enhancing solubility of the metal oxide by a liquid or vapor is performed at a pH of from about 4 to about 10.

9. The method of forming a structure of claim 1, wherein the metal oxide comprises tungsten oxide or copper oxide.

10. A structure formed by the method of claim 1.

11. A method of forming a structure, comprising:
   forming a dielectric layer on a substrate, a tungsten plug with tungsten oxide thereon in the dielectric layer,
   enhancing solubility of the metal oxide by using $H_2O$ with a temperature higher than about 10° C. or a liquid or vapor of a chemical with a temperature higher than about 15° C.,
   wherein the chemical comprises a pure polar solution or a polar solution with $H_2O$,
      wherein the step of forming the tungsten plug in the dielectric layer comprises: forming a contact hole in the dielectric layer; forming a tungsten layer in the contact hole and over the dielectric layer; and removing a portion of the tungsten layer above a surface of the dielectric layer, wherein the step of removing the portion of the tungsten layer comprises a chemical-mechanical polishing (CMP) process; and
   performing a CMP cleaning process after the CMP process, wherein the CMP cleaning process comprises a deionized (DI) water cleaning process, the step of enhancing the solubility of the tungsten oxide being performed after the deionized (DI) water cleaning process.

12. The method of forming a structure of claim 11, wherein the temperature of the $H_2O$ or the chemical increases an equilibrium constant of the solubility of the tungsten oxide.

13. The method of forming a structure claim 11, wherein the polar solution comprises ketone or alcohol.

14. The method of forming a structure of claim 11, wherein the temperature of the $H_2O$ or the chemical is from about 15° C. to about 100° C.

15. The method of forming a structure of claim 14, wherein a time for the step of enhancing solubility of the tungsten oxide by a liquid or vapor is not less than about 5 seconds.

16. The method of forming a structure of claim 11, wherein the step of enhancing solubility of the tungsten oxide by a liquid or vapor is performed at a pH of from about 4 to about 10.

17. A method of forming a structure, comprising:
providing a substrate having a dielectric layer thereon and a contact hole within the dielectric layer;
forming a tungsten layer in the contact hole and over the dielectric layer;
removing a portion of the tungsten layer above a surface of the dielectric layer by chemical-mechanical polishing (CMP) so as to form a tungsten plug with tungsten oxide thereon in the contact hole;
performing a CMP oxide buffing process;
performing a deionized (DI) water cleaning process; and
enhancing solubility of the tungsten oxide by using $H_2O$ or a chemical with a temperature from about 15° C. to about 100° C. for not less than about 5 seconds.

18. The method of forming a structure of claim 17, wherein the step of enhancing solubility of the tungsten oxide is performed after the step of performing the CMP oxide buffing process.

19. The method of forming a structure of claim 17, wherein the step of enhancing solubility of the tungsten oxide is performed after the step of performing the deionized (DI) water cleaning process.

20. A structure formed by the method of claim 17.

* * * * *